US005595933A

United States Patent [19]

Heijboer

[11] Patent Number: 5,595,933

[45] Date of Patent: Jan. 21, 1997

[54] METHOD FOR MANUFACTURING A CATHODE

[75] Inventor: Willem L. C. M. Heijboer, Eindhoven, Netherlands

[73] Assignee: U.S. Philips Corporation, New York, N.Y.

[21] Appl. No.: 520,444

[22] Filed: Aug. 29, 1995

Related U.S. Application Data

[62] Division of Ser. No. 415,025, Mar. 30, 1995, Pat. No. 5,475,281, which is a continuation of Ser. No. 193,624, Feb. 8, 1994, abandoned, which is a continuation of Ser. No. 832,141, Feb. 6, 1992, abandoned.

[30] Foreign Application Priority Data

Feb. 25, 1991 [NL] Netherlands .......................... 9100327

[51] Int. Cl.$^6$ .................................................... H01L 21/70

[52] U.S. Cl. ............................ 437/60; 437/916; 437/974; 148/DIG. 135

[58] Field of Search ............................ 437/60, 974, 916; 148/DIG. 135, DIG. 119, DIG. 120

[56] References Cited

U.S. PATENT DOCUMENTS

| | | | |
|---|---|---|---|
| 3,959,037 | 5/1976 | Gutierrez et al. | 437/916 |
| 4,251,909 | 2/1981 | Hoeberechts | 437/916 |
| 4,904,895 | 2/1990 | Tsukamoto et al. | 313/336 |
| 5,110,373 | 5/1992 | Nauger | 437/974 |
| 5,354,695 | 10/1994 | Leedy | 437/7 |

*Primary Examiner*—Tuan H. Nguyen
*Attorney, Agent, or Firm*—John C. Fox; Norman N. Spain

[57] ABSTRACT

A low-power cathode can be obtained by arranging it on a substrate (1), preferably of silicon, which is entirely or partly removed at the location of the emissive structure (11) by means of, for example, anisotropic etching. Because of its low power, the cathode is particularly suitable for multi-beam applications.

3 Claims, 1 Drawing Sheet

METHOD FOR MANUFACTURING A CATHODE

This is a division of application Ser. No. 08/415,025, filed Mar. 30, 1995, now U.S. Pat. No. 5,475,281, which is a continuation of application Ser. No. 08/193,624, filed Feb. 8, 1994, now abandoned, which is a continuation of application Ser. No. 07/832,141, filed Feb. 6, 1992, now abandoned.

BACKGROUND OF THE INVENTION

The invention relates to an electron source comprising a substrate with a heating element arranged at least at the location of an electron-emissive part of the electron source.

The invention also relates to a method of manufacturing such an electron source and to a cathode ray tube provided with such an electron source.

Electron sources of the type mentioned above are used in cathode ray tubes, particularly in flat display devices in which one electron source is often used for each column of pixels.

An electron source of the type mentioned in the opening paragraph is described in U.S. Pat. No. 4,069,436. The electron source described in this Patent has an electron-emissive layer which is separated from an underlying heating element by an insulating layer, which heating element is in its turn separated from the substrate by an insulating layer. Although this substrate is preferably chosen to be as thin as possible so as to reduce the overall dissipation, this causes problems because mechanical causes or thermal tensions may lead to breakage when using a small thickness. As the substrate should therefore have a minimum thickness, it retains a large thermal capacity. Consequently, a large part of the supplied energy is lost when (parts of) the substrate are heated so that the actual emissive material is not heated optimally, which is at the expense of the electron emission. Said large thermal capacity also causes a long reaction time of the cathode.

OBJECTS AND SUMMARY OF THE INVENTION

The present invention has, inter alia, for its object to eliminate these drawbacks as much as possible. More generally, it has for its object to provide an electron source having a low energy consumption and a short reaction time.

To this end an electron source according to the invention is characterized in that at least at the location of the electron-emissive part the substrate is thinner than at other locations.

The invention is based on the recognition that the thermal capacity of such an electron source is reduced considerably by arranging the actual electron source, and preferably also the heating element, as it were, on a thin film in the supporting body or the substrate. The electron source or cathode can then be heated to the desired emission temperature at a faster rate and at a low power. Due to the low power it is now possible to accommodate many cathodes in one envelope as in, for example multibeam devices.

The invention is further based on the recognition that such structures can easily be realised by anisotropically etching semiconductor materials such as, for example silicon.

A first preferred embodiment of a device according to the invention is characterized in that the substrate comprises silicon and a thin layer of silicon nitride, the silicon being removed substantially entirely at the location of the heating element.

The thermal capacity is now determined substantially entirely by the silicon nitride film which may be very thin (50–200 nm). Moreover, the silicon nitride functions as a good etch-stop during manufacture.

A further preferred embodiment of an electron source according to the invention is characterized in that the substrate is provided with at least one extra electrode on the surface on which the electron source is present. This electrode may be, for example, a single electrode functioning as acceleration electrode, but it may alternatively be a multiple electrode functioning as deflection electrode.

The heating element is preferably implemented as a meandering resistive track. Various mixtures can be used for the electron-emissive material, for example an emissive layer of barium-calcium-strontium carbonate on a carrier material of tungsten, cathode nickle or another suitable material. Instead of carbonates, metalorganic compounds (for example, the acetyl acetonates or acetates of barium, calcium and strontium) can be used for the emissive layer.

The electron source according to the invention may be made in different manners, dependent on the materials used.

A method in which semiconductor material is used for the substrate is characterized in that it starts from a layer of semiconductor material which is provided with a layer of etch-stopping material at the area of a first surface, in that the semiconductor material is at least locally etched away from a facing surface as far as the etch-stopping material, and in that a heating element is arranged on the first surface at the location of the resultant thinner pan of the substrate.

Notably in the case of silicon, a layer of silicon nitride can be used as an etch-stopping means, but an oxide layer or a highly doped surface layer may also be considered. If the first surface is a <100> surface, the depression from the other side can be advantageously obtained by means of anisotropic etching.

BRIEF DESCRIPTION OF THE DRAWING

These and other aspects of the invention will now be described in greater detail with reference to some embodiments and the drawing in which.

DESCRIPTION OF THE PREFERRED EMBODIMENTS

Figure 1:
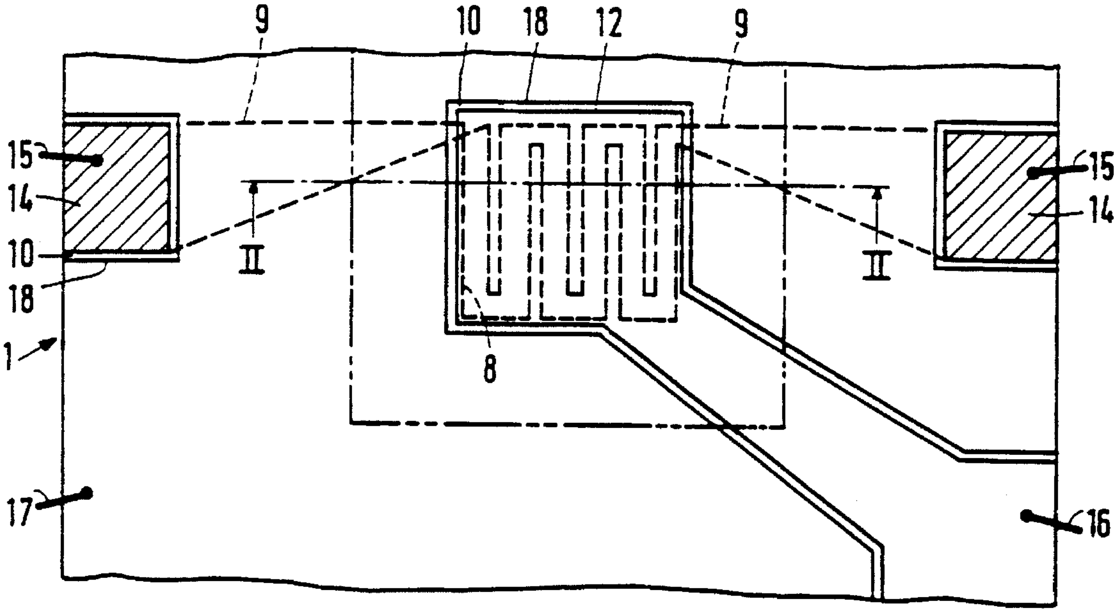
FIG. 1 is a diagrammatic plan view of an electron source according to the invention.
Figure 2:
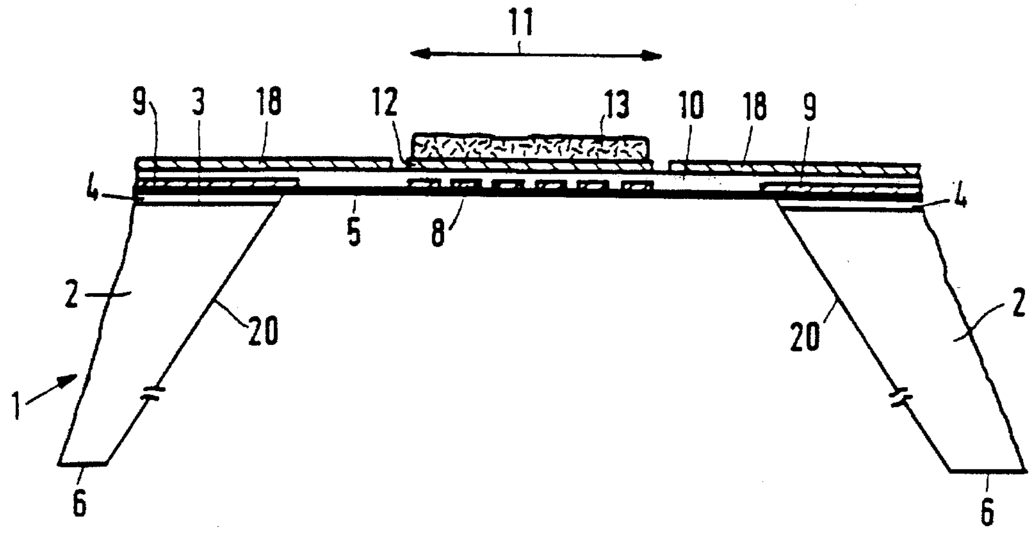
FIG. 2 is a diagrammatic cross-section taken on the line II—II in FIG. 1.

FIGS. 1 and 2 show diagrammatically and not to scale a plan view and a cross-sectional view, respectively, of an electron source 1 according to the invention. This source comprises a support or substrate 2 mainly consisting of silicon in this embodiment, with a thickness of approximately 0.4 mm. A first main surface 3 of the substrate 2 is provided with a thin layer 4 (approximately 50 nm) of silicon oxide and with a second layer 5 of silicon nitride having a thickness of approximately 120 nm. The overall surface area of the electron source 1 is approximately 2×2 $mm^2$.

At the location of the actual emissive pan 11, the substrate 2 is much thinner than outside this pan 11 because the substrate, viewed from the rear face 6, has a depression with side walls 7. In this case this depression has been obtained by means of anisotropic etching. Since the silicon nitride is used as an etch-stop in this embodiment, the substrate 2 (and the layer of silicon oxide) has completely disappeared at the location of the depression. However, this is not necessary, for example when a layer of highly doped silicon is used as an etch-stopping material.

A heating element 8, which is constituted by a resistive element, for example a meandering strip of a high melting point metal such as tungsten, tantalum or molybdenum and which is connected to external conductors 15 by means of connection strips 9 via bonding flaps 14, is present on the silicon nitride layer 5. The assembly is coated with a second protective layer 10 of silicon nitride, which layer 10 has apertures at the location of the bonding flaps 15. Materials such as aluminium nitride or oxide, boron nitride, hafnium oxide or zirconium oxide can also be chosen for the layer 10. Instead of a single metal layer 8, 9, a layer consisting of a plurality of sub-layers may also be chosen, if necessary, for example a titanium-tungsten-titanium layer or a titanium-molybdenum-titanium layer.

A metal pattern 12, in this embodiment of molybdenum, is present on the second silicon nitride layer 10, which pattern functions as cathode support at the location of the actual emissive pan 11 and can be given the desired cathode voltage via an external connection 16. Other suitable materials for the metal pattern 12 are, for example (cathode) nickle, tantalum, tungsten, titanium or double layers of titanium and tungsten or molybdenum. The choice also depends on the emissive material to be used and on the desired cathode temperature.

The emissive material 13, a barium-strontium carbonate in this embodiment, is present on this metal pattern 12 at the location of the actual emissive pan 11, directly above the heating element 8. Other possible materials are, for example a barium-calcium-strontium carbonate to which, if desired, small quantities of rare earth oxides are added. Moreover, it is possible to choose organometallic compounds as electron-emissive materials, for example an acetyl acetonate of barium, calcium or strontium. These compounds decompose to oxides at lower temperatures than the corresponding carbonates so that the electron source can be activated more rapidly.

Since, according to the invention, the substrate is much thinner at the location of the actual emissive layer 13 and the associated heating element 8 than at other locations (in the present embodiment the substrate is even etched away entirely), substantially no heat of conduction is lost in the substrate and the emissive material 13 is more rapidly heated to the desired temperature.

The device of FIGS. 1, 2 can be manufactured as follows.

The starting material is a silicon wafer 2 having a thickness of approximately 400 μm which is polished along its <100> faces and whose main surface 4 is provided with a layer 3 of thermal silicon oxide having a thickness of 50 nm. A silicon nitride layer 5 is provided on the layer of silicon oxide 3 by means of CVD methods, or the like. This layer 5 has a thickness of approximately 120 nm. Similar layers are simultaneously provided on the other side.

After the other side has been photolithographically provided with a mask having apertures at the location of the thinner parts to be formed, the silicon nitride and silicon oxide are removed in these apertures. Subsequently the silicon is anisotropically etched from the other side with a diluted solution of potassium hydroxide. The silicon nitride 5 then functions as an etch-stop.

The silicon nitride 5 is subsequently coated with a 200 nm thick layer of molybdenum. From this layer the metal pattern of the heating element 8, with the associated connection strips 9 and bonding flaps 14, is manufactured by etching in a solution of nitric acid, phosphoric acid and acetic acid in water. The assembly is subsequently coated with an approximately 200 nm thick layer 10 of silicon nitride which is provided by means of, for example sputtering. This process of manufacturing the heating element and providing the nitride layer 10 may also precede the anisotropic etching treatment. The silicon nitride 10 is removed at the location of the bonding flaps 14.

A 200 nm thick layer of molybdenum from which the metal pattern 12 is formed by means of etching and which functions as the actual cathode metallization is provided on the silicon nitride layer 10. In this embodiment a second metal pattern 18 is formed simultaneously. This metal pattern 18 may function, for example, as a grid in an ultimate arrangement in, for example an electron beam tube.

Subsequently the emissive layer 13 is provided, which consists of a layer of barium strontium carbonate in this embodiment. After the substrate has been divided into separate cathodes or groups of cathodes by means of scratching and breaking, connection wires 15, 16 and 17 are provided by means of, for example, thermocompression or other bonding techniques on the bonding flaps 14 as well as on suitable parts of the metal layer 12 and the grid 18. Said division into groups may be realised in such a way that one substrate 2 comprises, for example 3 separate emissive structures 11, for example for colour display tubes.

Cathodes thus obtained were tested at 700°–800° C. in a diode arrangement with a cathode-anode gap of 0.2 mm. At a continuous load, current densities of 0.3–2 $A/cm^2$ were measured. The lifetest results were also satisfactory.

The invention is of course not limited to the embodiment shown, but several variations are possible within the scope of the invention. For example, at the location of the emissive material to be provided the substrate 2 need not be etched away throughout its thickness, but a layer of silicon may remain, notably if it has a higher doping and consequently functions as an etch-stop.

Other methods of making the substrate locally thinner are alternatively possible. For example, dependent on the substrate material, other etchants may be used, but mechanical methods, for example, grinding are alternatively possible, notably when ceramic material substrates are used. Combinations of grinding and etching are also possible.

Moreover, the heating element may have various shapes. A device including this heating element only can of course be used in itself, or, for example, as a part of an (alkali) metal source or field emitter.

A metalorganic compound may alternatively be used as an emissive material in addition to numerous other generally known emissive materials. Similarly, several variations of the materials for the heating element, the connection layers and the other materials are possible, provided that they are chemically (and mechanically) compatible in a given combination.

I claim:

1. A method of manufacturing an electron source comprising:

a) providing a semiconductor substrate having opposing front and rear main surfaces with etch-barrier layers at said front and rear surfaces, said etch-barrier layers being thin relative to the thickness of said substrate, b) removing preselected portions of the etch-barrier layer present at said rear surface, c) anisotrophically etching said substrate starting from the rear surface until the etch-barrier provided at the front surface is reached thereby removing portions of said substrate corresponding to said preselected portions of the etch-barrier present at said rear surface, d) and before or after said etching, providing a heating element and a layer of an electron-emissive material on said front surface at the location of the etch-barrier layer provided at said front surface corresponding to said preselected portions.

2. The method of claim 1 characterized in that the front surface is subjected to a doping operation to thereby form an etch-barrier layer consisting of a comparatively thin, doped surface layer.

3. A method as claimed in claim 1 characterized in that the material of the semiconductor substrate is silicon and the material of the etch-barrier layers is silicon nitride or highly doped silicon.

* * * * *